US008448030B2

(12) United States Patent
Tiwary et al.

(10) Patent No.: US 8,448,030 B2
(45) Date of Patent: May 21, 2013

(54) METHOD AND APPARATUS FOR OPTIMIZING ADDRESS GENERATION FOR SIMULTANEOUSLY RUNNING PROXIMITY-BASED BIST ALGORITHMS

(75) Inventors: Abhishek Kumar Tiwary, Uttar Pradesh (IN); Anubhav Singh, Uttar Pradesh (IN); Anuj Verma, New Delhi (IN); Arnab Bhattacharya, Kolkata (IN)

(73) Assignee: Interra Systems Inc., Cupertino, CA (US)

( * ) Notice: Subject to any disclaimer, the term of this patent is extended or adjusted under 35 U.S.C. 154(b) by 368 days.

(21) Appl. No.: 12/930,082

(22) Filed: Dec. 24, 2010

(65) Prior Publication Data

US 2011/0209012 A1 Aug. 25, 2011

Related U.S. Application Data

(60) Provisional application No. 61/338,892, filed on Feb. 25, 2010.

(51) Int. Cl.
*H03M 13/00* (2006.01)

(52) U.S. Cl.
USPC .......................................... 714/718

(58) Field of Classification Search
USPC .................. 714/25–32, 36, 37, 38.1, 42, 718, 714/720, 733–739
See application file for complete search history.

(56) References Cited

U.S. PATENT DOCUMENTS

| 5,818,772 | A  | * | 10/1998 | Kuge ............................ 365/201 |
| 6,421,286 | B1 | * | 7/2002  | Ohtani et al. ................. 365/200 |
| 6,510,530 | B1 | * | 1/2003  | Wu et al. ......................... 714/30 |
| 6,560,740 | B1 | * | 5/2003  | Zuraski et al. ................ 714/733 |
| 6,728,910 | B1 | * | 4/2004  | Huang ........................... 714/711 |
| 7,409,607 | B2 | * | 8/2008  | Kuroda .......................... 714/702 |

* cited by examiner

*Primary Examiner* — Nadeem Iqbal
(74) *Attorney, Agent, or Firm* — Benjamin A. Balser; Balser & Grell IP Law

(57) ABSTRACT

The invention discloses a method and a system for optimizing address generation for simultaneously running proximity-based Built-In-Self-Test (BIST) algorithms. The method also describes simultaneously testing proximity-based faults for different memories having column multiplexers of different sizes using the BIST algorithms. The system described above may be embodied in the form of a Built-In-Self-Test (BIST) controller. Further, the method includes selecting a memory having the largest size of column multiplexer ($CM_{max}$). After selecting the memory, size of an address-width register is extended to form an extended address-width register. Thereafter, an extended width address is generated using the extended address-width register and the extended width address is used to generate addresses for the memories. After generating the addresses, read and write operations are performed on the memories based on pre-defined rules, wherein the read and write operations provide testing of the memories.

26 Claims, 9 Drawing Sheets

METHOD AND APPARATUS FOR OPTIMIZING ADDRESS GENERATION FOR SIMULTANEOUSLY RUNNING PROXIMITY-BASED BIST ALGORITHMS

REFERENCE TO RELATED APPLICATION

This application claims priority from U.S. provisional patent application Ser. No. 61/338,892 (filed on Feb. 25, 2010 titled "Method and apparatus for optimizing address generation for simultaneously running proximity-based BIST algorithms"), the content of which is incorporated herein by reference.

FIELD OF THE INVENTION

The present invention relates, in general, to the domain of memories. More particularly, the present invention relates to a method and an apparatus for optimizing address generation for simultaneously running proximity-based BIST (Built-In Self Testing) algorithms on a plurality of memories.

BACKGROUND

Integrated Circuits (ICs) like System-On-Chip (SOC) are extensively used in analog, digital, mixed signal and Radio Frequency (RF) applications. A SOC usually includes, among other things, a microprocessor core, external interfaces, timing sources, analog interfaces, and embedded memories. Various examples of embedded memories are RAMs, ROMs or EEPROMs, etc. Embedded memories are preferred over other memories, such as external memories, due to a number of advantages. For example, embedded memories have faster response time, reduced number of chips and reduced pin count, consume less power, and are more cost effective as compared to the external memories. Moreover, the usage of embedded memories with built-in column multiplexers provides additional flexibility in the physical design and layout of the SOC.

FIG. 1 illustrates a block diagram of embedded memory architecture 100 with a built-in 2:1 column multiplexer. The embedded memory architecture 100 includes an address pre-decoder 102, a row decoder 104, a column decoder 106, a memory array 108, a column multiplexer 110, a sense amplifier unit 112, a data buffer unit 114, and a data register unit 116. The column multiplexer 110 as shown in the figure is a 2:1 column multiplexer, which means that each physical row of the embedded memory is equivalent to two words. It should be appreciated by people skilled in the art that the size of the column multiplexer may be more than 2:1 based on the requirements of the embedded memory. Therefore, column multiplexing allows wider embedded memories for given physical dimensions. Over the years, due to reduction in the physical dimensions of the SOC, size of the embedded memories has shrunk while the bit density (number of bits stored per unit area) has increased. Due to the increased bit density, embedded memories become prone to manufacturing process faults, and more specifically to proximity-based faults (faults due to physical proximity of the bit cells). For embedded memory with built-in column multiplexers, the physical proximity could be word line-based proximity or bit line-based proximity.

FIG. 2 illustrates word line proximity and bit line proximity in a memory array 200. The memory array 200 represents a row and column arrangement of bit cells, such as a bit cell 202. The memory array 200 includes two consecutive bit lines, such as bit lines 204a and 204b, and two consecutive word lines, such as word lines 206a and 206b. It should be realized by people skilled in the art that each bit cell, such as the bit cell 202, may be represented by the intersection of bit lines and word lines. Further, the memory array 200 includes a row address (X-address) space 208 and a column address (Y-address) space 210 representing the range of consecutive row and column addresses respectively. In case of bit line-based proximity, the consecutive bit cells differ in Y-address. For the word line-based proximity, the consecutive bit cells differ in X-address. BIST mechanism is generally used for testing the proximity-based faults, both-word line-based proximity faults and bit line-based proximity faults. In a typical BIST mechanism, a BIST controller is connected to the embedded memory. The BIST controller writes and reads the test pattern on different memory locations.

A single BIST controller is used to generate addresses corresponding to the memory cells contained in the various embedded memories. Further, the embedded memories have the same functional behavior but may have different structures. The difference in structure includes different number of physical rows, columns, different sizes of the column multiplexer, and so forth. The sequential testing of the various embedded memories using BIST may require considerable amount of time, primarily for address generation. Simultaneously testing the various embedded memories may reduce the testing time.

Various techniques exist in the art to simultaneously test multiple embedded memories having column multiplexers' of different sizes. One such technique is to generate a single address which is applicable for the memory with the largest column multiplexer, hereinafter referred to as primary memory. This address is appropriately transformed into addresses for other memories, hereinafter referred to as secondary memories. The transformation of the address generated for the primary memory to a valid secondary memory address is based upon the address generated for the primary memory, the ratio of the primary memory column multiplexer size to the secondary memory column multiplexer size, and the column multiplexer size of the secondary memory.

A limitation of the above mentioned technique is failure to test a range of memory locations of the secondary memories. This may happen in a scenario when the number of physical rows in the secondary memory is more than the number of physical rows in the primary memory. Further, there may be a few memory locations in the secondary memory which are tested more than once, leading to duplication of effort and elongation in testing time. Moreover, the generated address sequence of addresses may be incorrect with respect to the address sequence as required by the proximity-based BIST algorithm.

Another technique for simultaneous testing of the multiple embedded memories is to generate addresses individually for each memory. This technique suffers from the limitation of requiring a larger chip area for storing one address register for each memory. Typically, for a large number of embedded memories on the SOC, the increase in chip area is significant, and leads to an increment in the manufacturing cost of the product.

In view of the aforesaid challenges, there exists a need for an optimized method and a system to generate addresses for memories and simultaneously test the memories using a single Built-in Self Testing (BIST) controller. The method should simultaneously test different memories having different sizes of the column multiplexer preferably with all the address locations being tested only once. Thus, a lot of time and effort is saved. Further, the method should preferably not result in a significant increase in the chip area requirement, and should preferably maintain the correct address sequence of the memories as generally required by a proximity-based BIST algorithm.

SUMMARY

The present invention describes a method for generating addresses for memories and simultaneously testing the memories using a single Built-in Self Testing (BIST) controller. Preferably, each of the memories includes one or more memory locations and a corresponding pre-defined number of physical rows. The memories as described herein can be, but are not limited to, embedded memories. The method includes selecting a memory of the memories based on a pre-defined rule. The pre-defined rule includes selecting the memory having the largest size of column multiplexer. After selecting the memory, the pre-defined number of physical rows of the selected memory is compared with the pre-defined number of physical rows of other memories. The selected memory is referred to as primary memory and other memories are referred to as secondary memories. Thereafter, the size of an address-width register is extended to form an extended address-width register based on the comparison performed above. After this, an extended width address is generated using the extended address-width register. The extended width address is used to generate addresses for the memories. The extended width address is referred to as primary address and the addresses generated using it are referred to as secondary addresses. Subsequently, read and write operations on the memories are performed using the single BIST controller based on pre-defined rules. The pre-defined rules include comparing data with test patterns written in each of the memory locations. Accordingly, a status signal is generated indicating whether the memory has failed or passed the test.

The present invention further describes an optimized method for generating addresses for memories using a single Built-in Self Testing (BIST) controller. Preferably, each of the memories includes one or more memory locations and corresponding pre-defined number of physical rows. The method includes extending the size of an address-width register to form an extended address-width register based on a pre-defined check. The pre-defined check includes comparing the pre-defined number of physical rows of the selected memory with the pre-defined number of physical rows of the other memories. Further, the memory with the largest size of column multiplexer ($CM_{max}$) is selected. After extending the size as described above, an extended width address (primary address) is generated using the extended address-width register. Lastly, secondary addresses for the memories using the primary address are generated.

Further, the present invention provides a method for simultaneously testing memories using a single Built-in Self Testing (BIST) controller. Preferably, each of the memories includes one or more memory locations. The method disclosed above includes writing test patterns into preferably each of the memory locations corresponding to the addresses generated by the single BIST controller. After this, data from each of the memory locations is read. Thereafter, the data is compared with the test patterns written in the memory locations. Subsequently, a status signal is generated for each of the memory locations based on the comparison above. The status signal indicates whether the memory location fails or passes the test.

Moreover, the present invention discloses a Built-in Self Testing (BIST) controller for generating addresses for memories and simultaneously testing the memories. Preferably, each of the memories includes one or more memory locations and a corresponding pre-determined number of physical rows. The BIST controller includes an address generator and the address generator includes an address-width register. The address generator is configured for extending the size of the address-width register to form an extended address-width register based on a pre-defined check. The pre-defined check includes comparing the pre-determined number of physical rows of the selected memory with the pre-determined number of physical rows of the other memories. Further, the address generator is configured for generating an extended width address for a memory, and the extended width address is used to generate addresses for the memories. The extended width address is generated by the address generator using the extended address-width register. Moreover, the BIST controller disclosed above includes one or more comparators, the one or more comparators are configured for testing the addresses generated by the address generator. Additionally, the BIST controller includes one or more shift registers, one or more address clippers, one or more adders, and one or more multiplexers.

Additionally, the present invention describes a computer program product for use with a computer, the computer program product comprising a tangible computer usable medium having a computer readable program code embodied therein for generating addresses for memories and simultaneously testing the memories using a single Built-in Self Testing (BIST) controller. Each of the memories, for example, includes one or more memory locations. The computer readable program code includes program instructions for selecting a memory of the memories based on a pre-defined rule, where preferably each of the memories has a corresponding pre-defined number of physical rows. The computer readable program code further includes program instructions for comparing the pre-defined number of physical rows of the selected memory with the pre-defined number of physical rows of the other memories. Further, the computer readable program code includes program instructions for extending the size of an address-width register to form an extended address-width register based on the comparison. Moreover, the computer readable program code includes program instructions for generating an extended width address using the extended address-width register, and the extended width address is used to generate addresses for the memories. Additionally, the computer readable program code includes program instructions for performing read and write operations on the memories using the single BIST controller based on pre-defined rules, wherein the read and write operations facilitate testing of the memories.

BRIEF DESCRIPTION OF THE DRAWINGS

The accompanying figures, wherein like reference numerals refer to identical or functionally similar elements throughout the separate views, and which, together with the detailed description below, are incorporated in and form part of the specification, serve to further illustrate various embodiments and explain various principles and advantages, all in accordance with the present invention.

DETAILED DESCRIPTION OF THE INVENTION

Figure 1:
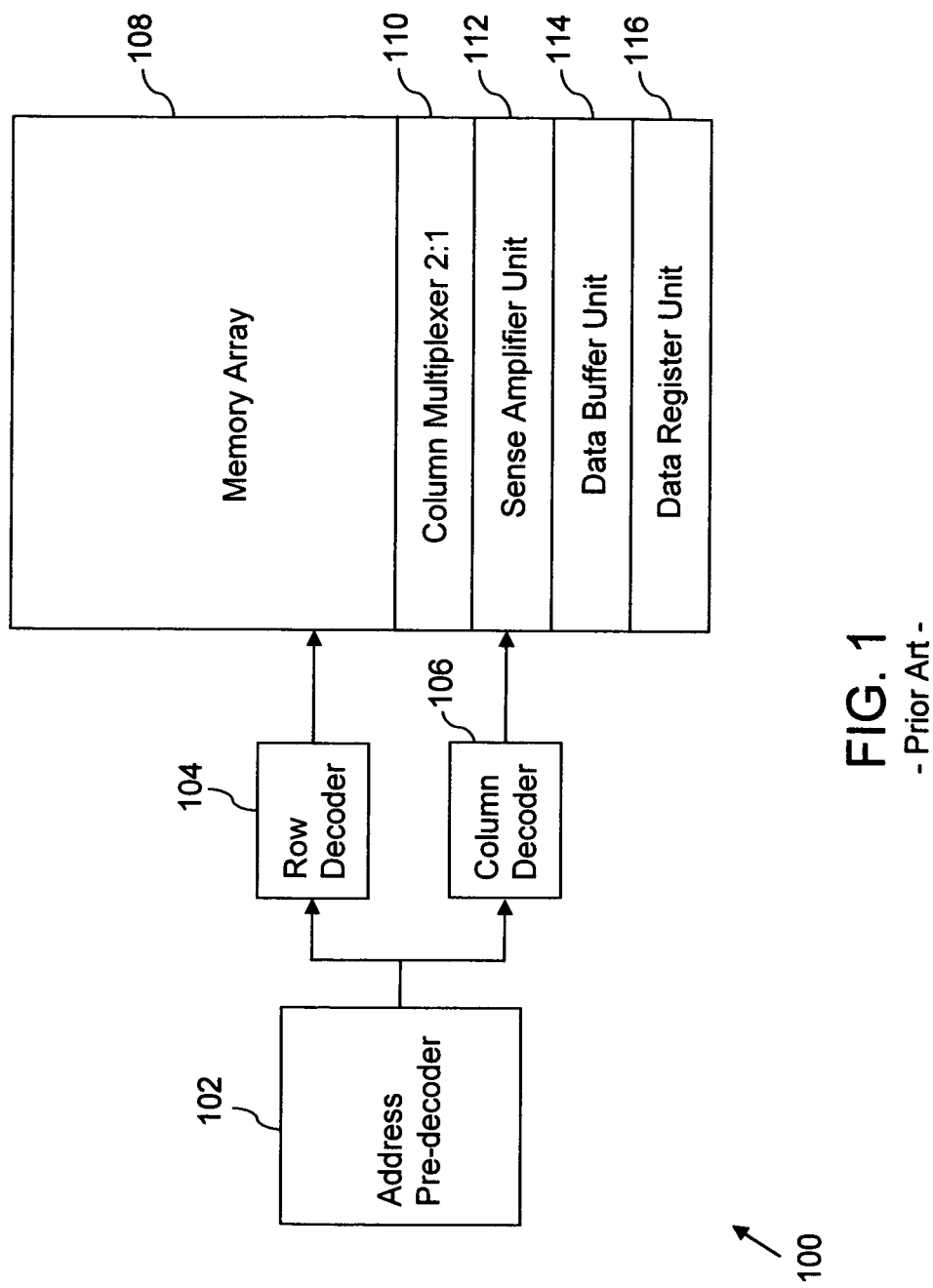
FIG. 1 illustrates a block diagram of a prior art architecture of a memory with built-in 2:1 column multiplexer.
Figure 2:
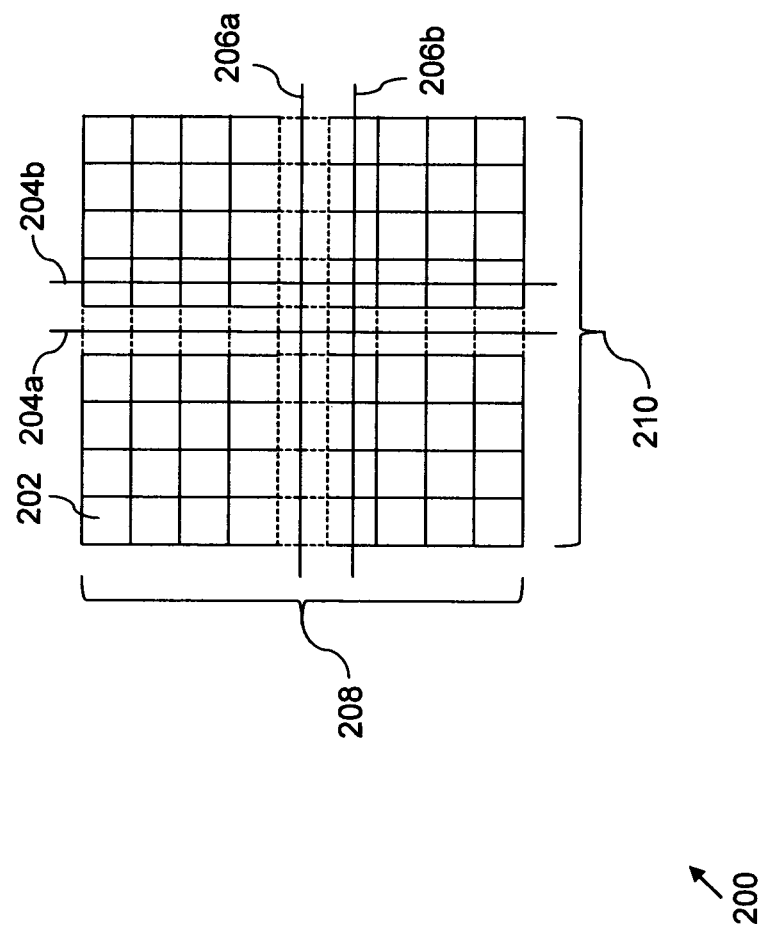
FIG. 2 depicts the word line proximity and bit line proximity in a prior art memory array.

Before describing in detail the particular method used for generating addresses and simultaneous testing of memories in accordance with various embodiments of the present invention, it should be observed that the present invention utilizes a combination of method steps and apparatus components related to the method as described herein. Accordingly, the apparatus components and method steps have been represented in the drawings, where appropriate, with conventional symbols, showing only those specific details that are pertinent for an understanding of the present invention, so as not to obscure the disclosure with details that will be readily apparent to those with ordinary skill in the art having the benefit of the description herein.

In this document, the terms 'comprises,' 'comprising,' 'includes,' 'including,' or any other variation thereof, are intended to cover a non-exclusive inclusion, such that a process, article, system or apparatus that comprises a list of elements does not include only those elements, but may include other elements not explicitly listed or inherent to such a process, article or apparatus. The term 'another', as used in this document, is defined as at least a second or more. The terms 'includes' and/or 'having', as used herein, are defined as comprising.

Broadly, the objective of the present invention is to generate addresses for memories and simultaneously testing the memories using a single Built-in Self Testing (BIST) controller. The memories described herein are embedded memories. In particular, the main objective of the present invention is to simultaneously test proximity-based faults in multiple memories having the same or different sized column multiplexers using a single extended address-width register. Memories with built-in column multiplexer are tested for word line-based proximity faults and bit line-based proximity based faults using the single BIST controller. The BIST controller is connected in parallel to different memories and further generates addresses of the different memory locations in the memories. The addresses are generated using a single extended address-width register.

Figure 3:
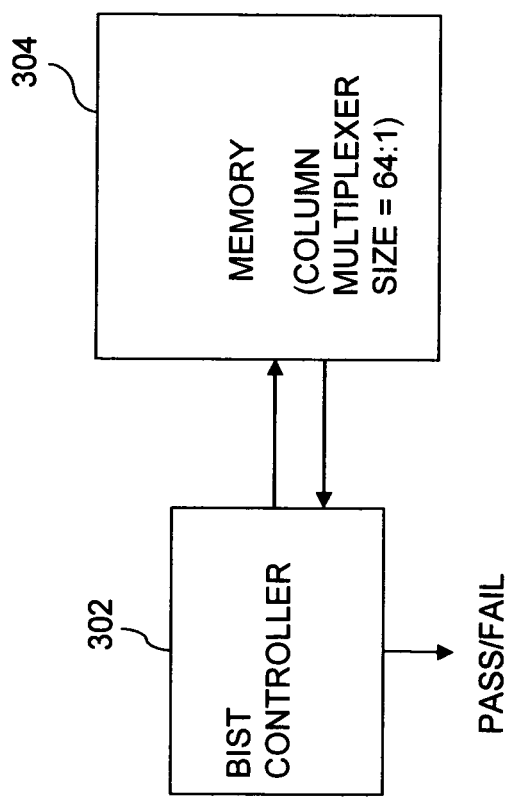
FIG. 3 shows a block diagram of a system for testing a memory using a single Built-in Self Testing (BIST) controller, in accordance with an embodiment of the present invention.

FIG. 3 shows a block diagram of a system 300 for testing a memory using a single Built-in Self Testing (BIST) controller, in accordance with an embodiment of the present invention. To describe the system 300 as illustrated in FIG. 3, references will be made to FIGS. 4, 5, 6, 7, 8 and 9, although it will be apparent to those skilled in the art that the implementation details of the system can be applicable to any other embodiment of the present invention.

The system 300 includes a BIST controller 302 connected to a memory 304. The memory 304 includes a 64:1 column multiplexer. The memory 304 includes one or more memory locations. The memory locations may also be referred to as memory cells. The BIST controller 302 generates addresses of the memory locations present in the memory 304. Thereafter, the BIST controller 302 writes test patterns in the memory locations present in the memory 304 corresponding to the generated addresses. The BIST controller 302 then reads the data written in the various memory locations and compares the data with the test patterns originally written in the memory locations of the memory 304. If the data read from the memory locations is not identical to the data originally written, the comparison test fails. Otherwise, the comparison test passes. Accordingly, a status signal is generated by the BIST controller 302 indicating whether the memory has passed or failed the test.

Figure 4:
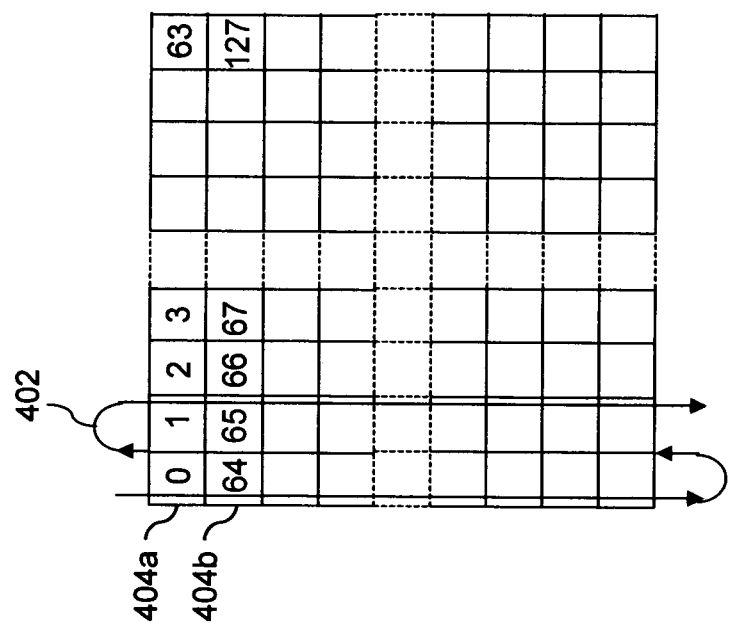
FIG. 4 illustrates the sequence of address generation for testing a memory with a 64:1 built-in column multiplexer, in accordance with an embodiment of the present invention.

FIG. 4 illustrates the sequence of address generation for testing a memory 304 (refer to FIG. 3) with a 64:1 built-in column multiplexer, in an accordance with an embodiment of the present invention. To describe the sequence of address generation as illustrated in FIG. 4, references will be made to FIGS. 3, 5, 6, 7, 8 and 9, although it will be apparent to those skilled in the art that the implementation details of the figure can be applicable to any other embodiment of the present invention.

The figure depicts a testing path 402, and memory cells 404a and 404b. The testing path 402 depicts a sequence of address generation for testing word-line based proximity faults for the memory 304 using the BIST controller. As mentioned above, the BIST controller 302 (FIG. 3) generates addresses of the memory locations contained in the memory 304. As shown, the addresses are generated for a sequence such that the memory locations for which the addresses are generated lie along the testing path 402. Initially the address '0' is generated corresponding to the memory cell 404a. Since the memory 304 includes a 64:1 column multiplexer, the address corresponding to the memory cell 404a is incremented by 64 to generate the memory address corresponding to the memory cell 404b. Similarly, the addresses for the remaining memory cells that lie along the testing path 402 are generated.

Figure 5:
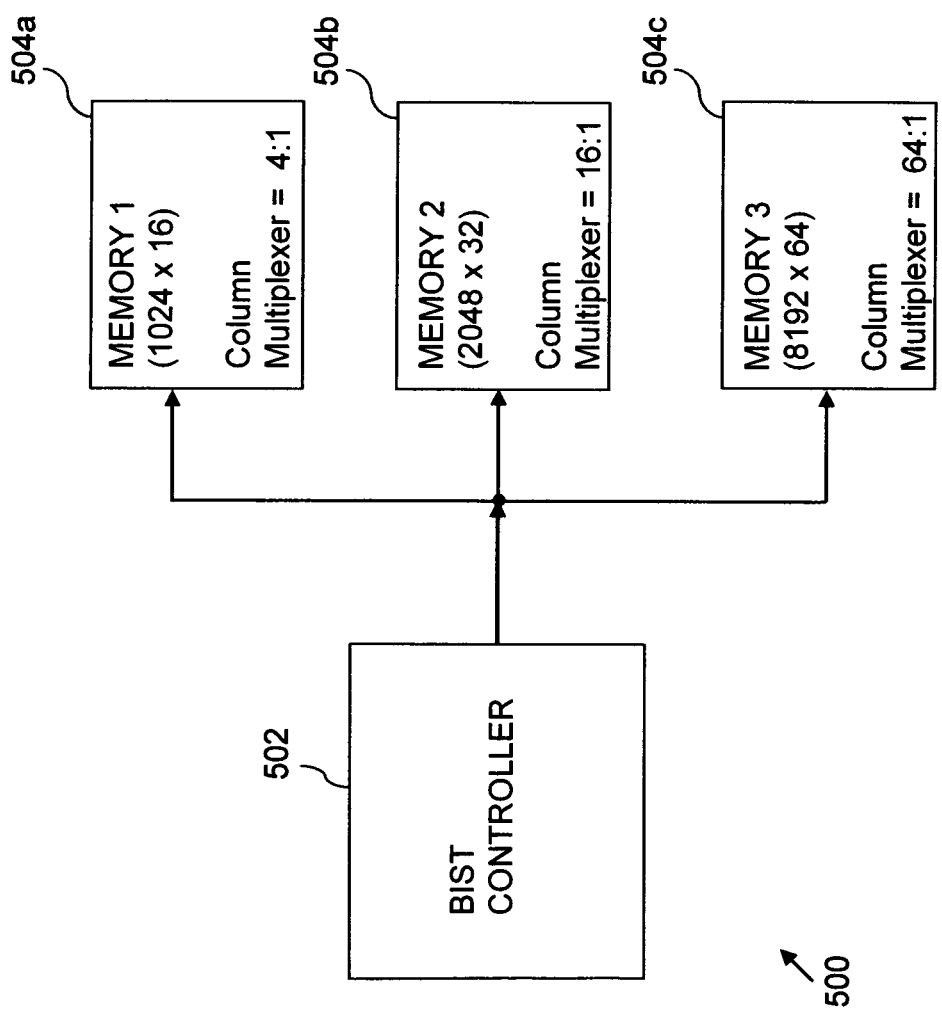
FIG. 5 is block diagram of a system for simultaneously testing three memories having different word length, number of words and size of column multiplexer, in accordance with an embodiment of the present invention.

FIG. 5 illustrates a block diagram of a system 500 for simultaneously testing three memories, in accordance with an embodiment of the present invention. The system 500 includes a BIST controller 502 and memories 504a, 504b, and 504c. To describe the system as illustrated in FIG. 5, references will be made to FIGS. 3, 4, 6, 7, 8 and 9, although it will be apparent to those skilled in the art that the implementation details of the figure can be applicable to any other embodiment of the present invention.

The testing procedure followed by the BIST controller 502 for testing the memory 504a will now be explained in detail. The memory 504a includes one or more memory locations. The BIST controller 502 generates addresses corresponding to the memory locations present in the memory 504a. Thereafter, the BIST controller 502 writes test patterns in the memory locations of the memory 504a corresponding to the generated addresses. The BIST controller 502 then reads the data written in the various memory locations and compares the data with the test patterns originally written in the memory locations of the memory 504a. If the data read from the memory 504a is identical to the test patterns written, the memory 504a passes the test. Otherwise the memory 504a fails the test. The BIST controller 502 preferably simultaneously executes similar steps, as described above, for the remaining memories.

In accordance with various embodiments of the present invention, the memories may be SRAM, DRAM, and so forth. Further, in various embodiments of the present invention, the memories may have any storage capacity, word length and size of the column multiplexer compatible with the SOC hardware. For example, in the system 500 the memory 504a has 1024 words, 16 bit word length and a column multiplexer of size 4:1. The memory 504b has 2048 words, 32 bit word length and a column multiplexer of size 16:1. The memory 504c has 8192 words, 64 bit word length and a column multiplexer of size 64:1.

Figure 6:
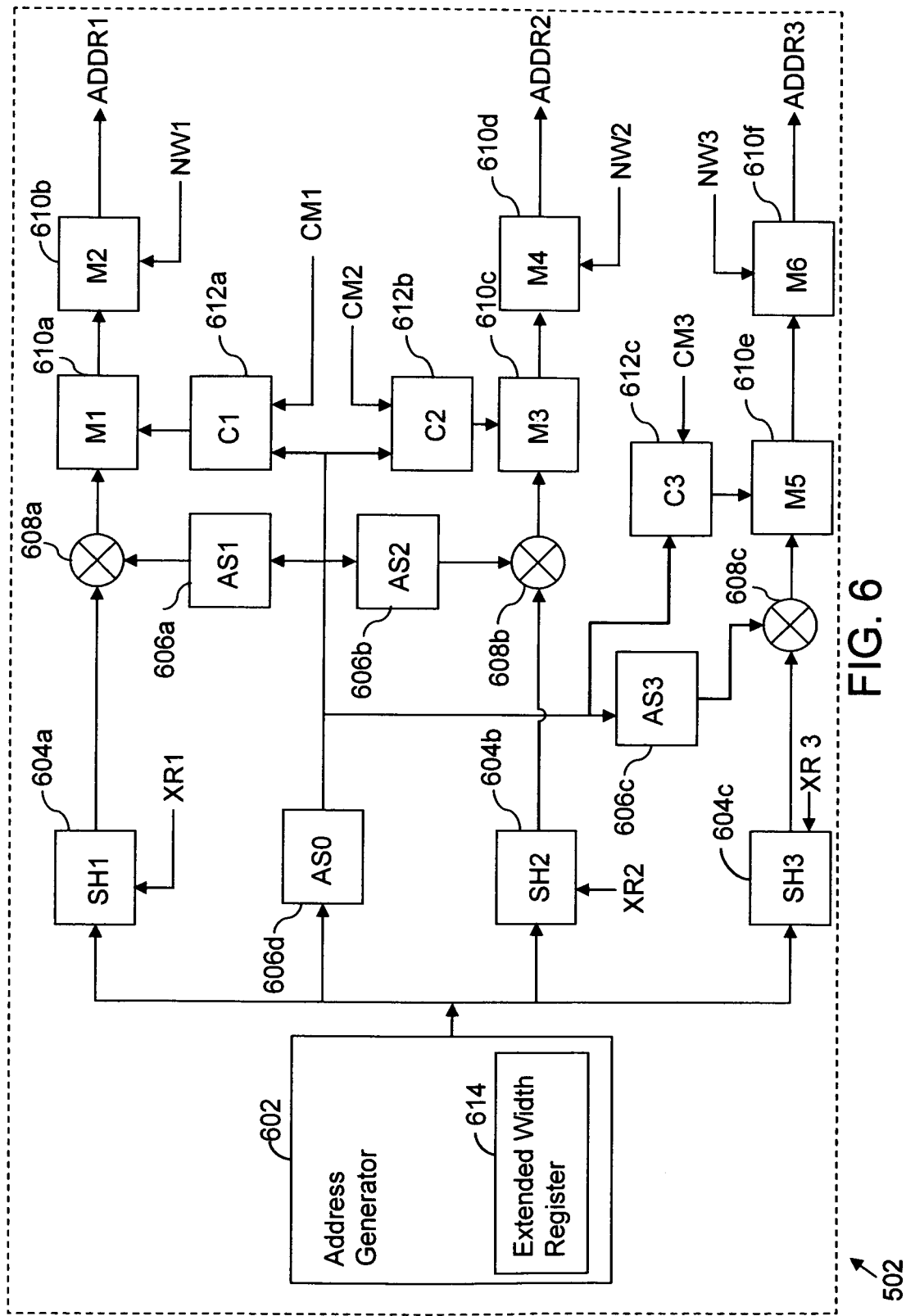
FIG. 6 is a schematic diagram of the BIST controller for simultaneously testing of three memories having column multiplexers of different sizes, in accordance with an embodiment of the present invention.

FIG. 6 is a schematic diagram of the BIST controller 502 for simultaneously testing of three memories having column multiplexers of different sizes, in accordance with an embodiment of the present invention. To describe the BIST controller illustrated in FIG. 6, references will be made to FIGS. 3, 4, 5, 7, 8 and 9, although it will be apparent to those skilled in the art that the implementation details of the figure can be applicable to any other embodiment of the present invention.

The BIST controller 502 includes: an address generator 602; address shifters 604a (SH1), 604b (SH2), and 604c (SH3); address clippers 606a (AS1), 606b (AS2), 606c (AS3), and 606d (AS0); adders 608a, 608b, and 608c; multiplexers 610a (M1), 610b (M2), 610c (M3), 610d (M4), 610e (M5), and 610f (M6); and comparators 612a (C1), 612b (C2), and 612c (C3). The address shifters 604a (SH1), 604b (SH2), and 604c (SH3) may be referred to as shift registers. In accordance with an embodiment of the present invention, an address-width register (not shown in the figure) forms a part of the address generator 602. The address-width register is extended to form an extended address-width register 614 based on the comparison described above.

The address generator 602 generates addresses corresponding to the memory locations using the extended address-width register 614. The size of the extended address-width register 614 is given by the following mathematical expression:

$$EAW = CMW + \log_2\left[\frac{PR_{Maximum}}{PR_{CMMax}}\right] \quad (1)$$

wherein,

EAW refers to the Extended Address-Width register size and CMW refers to the memory address width corresponding to the memory with the largest size of column multiplexer. For example, as stated above the memory 504c (FIG. 5) has the largest size of column multiplexer. Thus, CMW refers to the memory address width of the memory 504c. Since the memory 504c has 8192 memory locations, therefore the value of CMW is 13 bits ($2^{13}$=8192). $PR_{Maximum}$ is the maximum number of physical rows among all the memories, and $PR_{CM\,Max}$ is the number of physical rows in the memory with the largest size of column multiplexer, i.e. the memory 504c. The number of physical rows for memories 504a, 504b and 504c is given by the following mathematical expression:

$$PR = \left[\frac{NW}{CM}\right] \quad (2)$$

wherein,

PR refers to the number of physical rows in the memory, NW refers to the number of words in the memory, and CM refers to the size of the column multiplexer of the memory. In the example explained, the number of words and the size of column multiplexer for the memory 504a are 1024 and 4:1 respectively. Hence, the number of physical rows for memory 504a is 256 (1024/4). Similarly, the number of physical rows for memory 504b and 504c are 128 (2048/16) and 128 (8192/64) respectively. Therefore, $PR_{Maximum}$ is 256 which corresponds to the memory 504a. Further, the value of $PR_{CM\,Max}$ is 128 which corresponds to memory 504c. Thus, the size of extended address-width register 614 will be 14 bits (EAW=13+$\log_2$ (256/128)=14). It should be understood that the extended address-width register size equals the number of bits required to address a memory having a number of memory locations=16384 ($2^{14}$). The memory mentioned above having the number of memory locations corresponding to the size of the extended address-width register will be hereinafter referred to as an extended address-width memory. Further, the memories present in the system 500, such as the memories 504a, 504b, and 504c will be hereinafter referred to as secondary memories 504a, 504b, and 504c. As described above, the extended address-width register size is calculated using the value of $PR_{Maximum}$. Additionally, the addresses for the secondary memories are derived from the extended address generated for the extended address-width memory. Therefore, the sequence of address generation is correct for all the memories with respect to the sequence required by the proximity-based BIST algorithm. Thus, if addresses are generated using the extended address-width space and the maximum column multiplexer, memory locations of all the memories are tested in a correct address sequence as required by the proximity-based BIST algorithm.

The address generator 602 generates primary address using the extended address-width register 614. Since the primary address is generated corresponding to the extended address width, the primary address will be hereinafter referred to as the extended width address. Thereafter, the extended address is provided to the address shifters 604a, 604b, and 604c, and the address clipper 606d. The address shifter 604a right shifts the address generated by the address generator 602 by XR1 bits to generate a row address for the secondary memory 504a. XR1 is the ratio of the maximum size of the column multiplexer to the size of the column multiplexer for the secondary memory 504a. For example, if the size of the extended address-width register is 14, the unique address generated by the address generator 602 is '65' (decimal equivalent of '00000001000001'), XR1 is 4 bits, and the row address generated by the address shifter 604a is '4' (decimal equivalent of '00000000000100'). Furthermore, address shifters 604b and 604c right shift the unique address by XR2 bits and XR3 bits, respectively. XR2 is the ratio of the maximum size of the column multiplexer to the size of the column multiplexer for the secondary memory 504b, and XR3 is the ratio of the maximum size of the column multiplexer to the size of the column multiplexer for the secondary memory 504c.

The address clipper 606d clips the address generated by the address generator 602 to generate column address for the extended address-width memory. The address clippers 606a, 606b and 606c clip the address generated by the address clipper 606d to generate column addresses for the secondary memories. The column addresses thus generated are the last significant (log$_2$ CM) bits of the address generated by the address generator 602 wherein CM is the size of the column multiplexer of the secondary memory. As an example, if the size of the column multiplexer for the secondary memory is 16 and the address generated by the address generator 602 is "65" (decimal equivalent of "00000001000001"), the column address generated for the secondary memory would be "1" (decimal equivalent of last 4 significant bits of "00000001000001"). The desired bits are calculated as (log$_2$ 16), which is equal to 4 in this case). Further, the row address generated by the address shifter 604a and the column address generated by the address clipper 606a is provided to the adder 608a. The adder 608a arithmetically adds the row address generated by the address shifter 604a and the column address generated by the address clipper 606a. Similarly, the row address generated by the address shifter 604b and the column address generated by the address clipper 606b is provided to the adder 608b. Also, the row address generated by shifter 604c and the column address generated by the address clipper 606c is provided to the adder 608c.

The column addresses generated by the address clippers 606a, 606b, and 606c are provided to the comparators 612a, 612b, and 612c, respectively. The comparator 612a compares the column address generated by the address clipper 606a with the size of the column multiplexer of the secondary memory 504a. If the column address generated by the address clipper 606a is less than the size of the column multiplexer of the secondary memory 504a, the multiplexer 610a transfers the address generated by the adder 608a to the multiplexer 610b. Further, when the column address generated by the address clipper 606a is equal to or more than the size of the column multiplexer of the secondary memory 504a, the multiplexer 610a blocks the address generated by the adder 608a. Similar processes of transferring the address ensue for the secondary memories 504b and 504c.

The multiplexers 610a, 610c, and 610e transfer or block the addresses generated by the adders 608a, 608b, and 608c depending on the comparison by the comparators 612a, 612b, and 612c. The multiplexers 610b, 610d, and 610f transfer or block the addresses provided by the multiplexers 610a, 610c, and 610e respectively. The multiplexer 610b transfers the address provided by the multiplexer 610a as ADDR1 to the secondary memory 504a. This step is executed when the address provided by the multiplexer 610a is less than the address space of the secondary memory 504a. The address space of the secondary memory 504a refers to the number of words of the secondary memory 504a. If the address provided by the multiplexer 610a is equal to or more than the address space of the secondary memory 504a, the address transferred by the multiplexer 610a is blocked and not provided to the secondary memory 504a. Similar processes of providing/blocking addresses ensues for the secondary memory 504b and the secondary memory 504c. Therefore, the multiplexers 610a, 610c, and 610e prevent multiple accesses of memory locations by the BIST controller 502. Further, the multiplexers 610b, 610d, and 610f prevent unintentional accesses of memory locations by the BIST controller 502.

Figure 7:
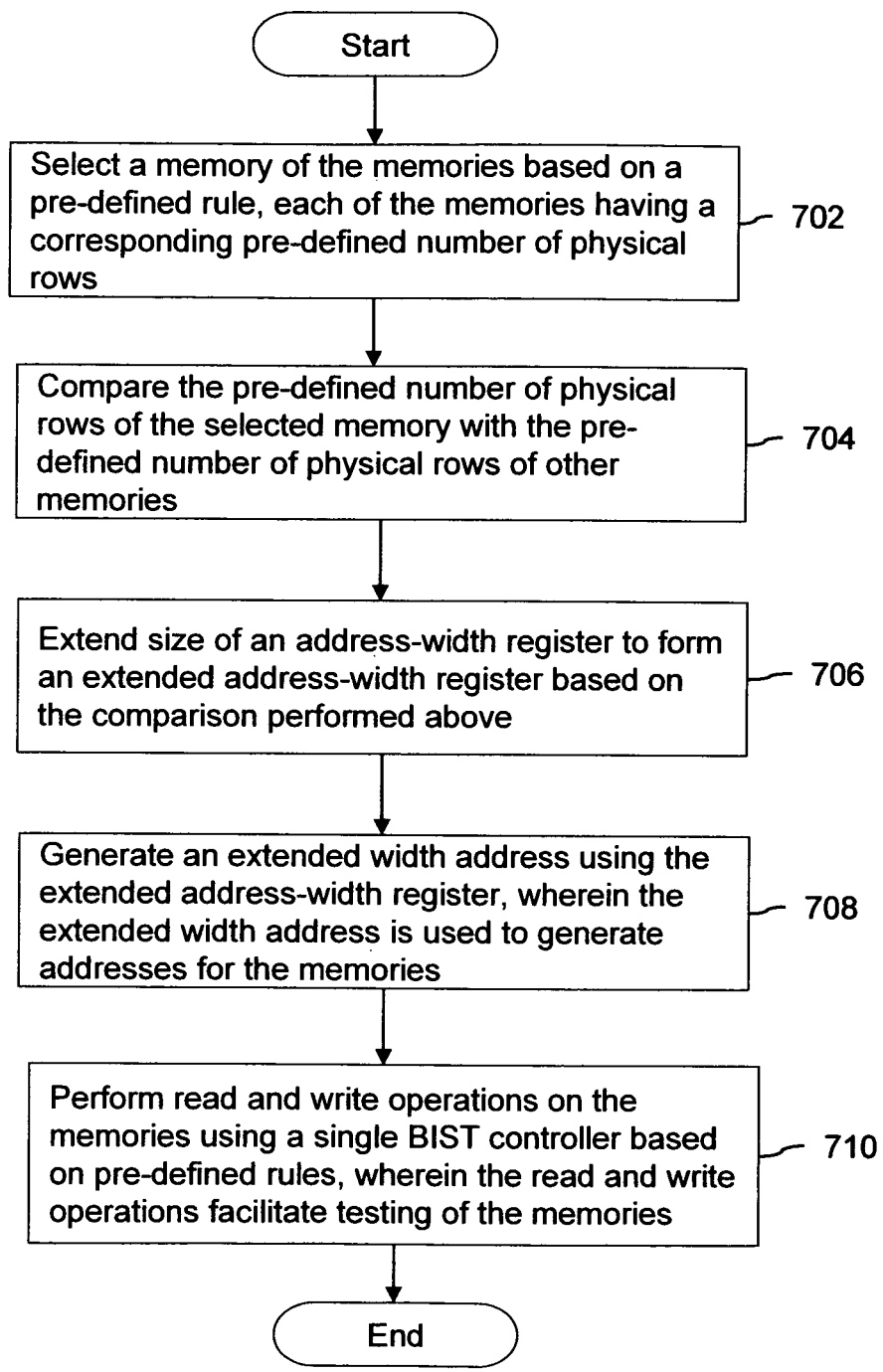
FIG. 7 depicts a flow chart for generating addresses for memories and simultaneously testing the memories using a single Built-in Self Testing (BIST) controller, in accordance with an embodiment of the present invention.

FIG. 7 depicts a flow chart for generating addresses for memories and simultaneously testing the memories using a single Built-in Self Testing (BIST) controller, in accordance with an embodiment of the present invention. To describe the flowchart illustrated in FIG. 7, references will be made to FIGS. 3, 4, 5, 6, 8 and 9, although it will be apparent to those skilled in the art that the implementation details of the figure can be applicable to any other embodiment of the present invention.

At 702, a memory of the memories is selected based on a pre-defined rule. Each of the memories has one or more memory locations and further each of the memories has a corresponding pre-defined number of physical rows. The pre-defined number of physical rows of the memory depends on the size of the memory and it further depends on the size of the column multiplexer. The selected memory may be referred to as primary memory and other memories are referred to as secondary memories. The pre-defined rule includes selecting the memory having the largest size of column multiplexer (CM). Once the memory is selected, then at 704, the pre-defined number of physical rows of the selected memory is compared with the pre-defined number of physical rows of other memories. Then at 706, the size of an address-width register is extended to form an extended address-width register based on the comparison performed above.

Thereafter, at 708, an extended width address is generated using the extended address-width register. The extended width address is used to generate addresses for the memories. The extended width address is generated using a pre-defined mathematical expression as described above in equation (1). Further, the extended width address is generated in a number of cycles equal to the size of a column multiplexer of the selected memory. Furthermore, an index to count the number of cycles is maintained. The extended width address may be referred to as the primary address and the addresses generated using the primary address may be referred to as secondary addresses. The secondary addresses are generated after comparing the extended width address with an address space of the extended address-width memory.

After generating the addresses, at 710, read and write operations are performed on the memories using the single BIST controller based on pre-defined rules. The read and write operations include writing test patterns in each of the memory locations, and reading data written in each of the memory locations. The pre-defined rules include comparing the data with the test patterns written in each of the one or more memory locations. Moreover, the read and write operations provide testing of the memories. Accordingly, a status signal is generated indicating whether the memory has failed or passed the test.

In accordance with an embodiment of the present invention, the flowchart described herein may be implemented on a plurality of memories having different or same sized column multiplexers, different or same sized memory locations, and different or same number of memory locations.

The methodology of the present invention can be implemented based on various types of memories and their usage, for example, but not limited to, standalone memories and embedded memories. The present invention will be applicable to other memories as well as their corresponding usage. Those ordinarily skilled in the art can appreciate that the memories and their usage mentioned above are exemplary in nature and are simply used to facilitate the description of the present invention. The types of memories and their usage may vary depending upon the specific embodiment. Accordingly, it is clear that that the invention is not limited to the embodiments described herein.

Figure 8:
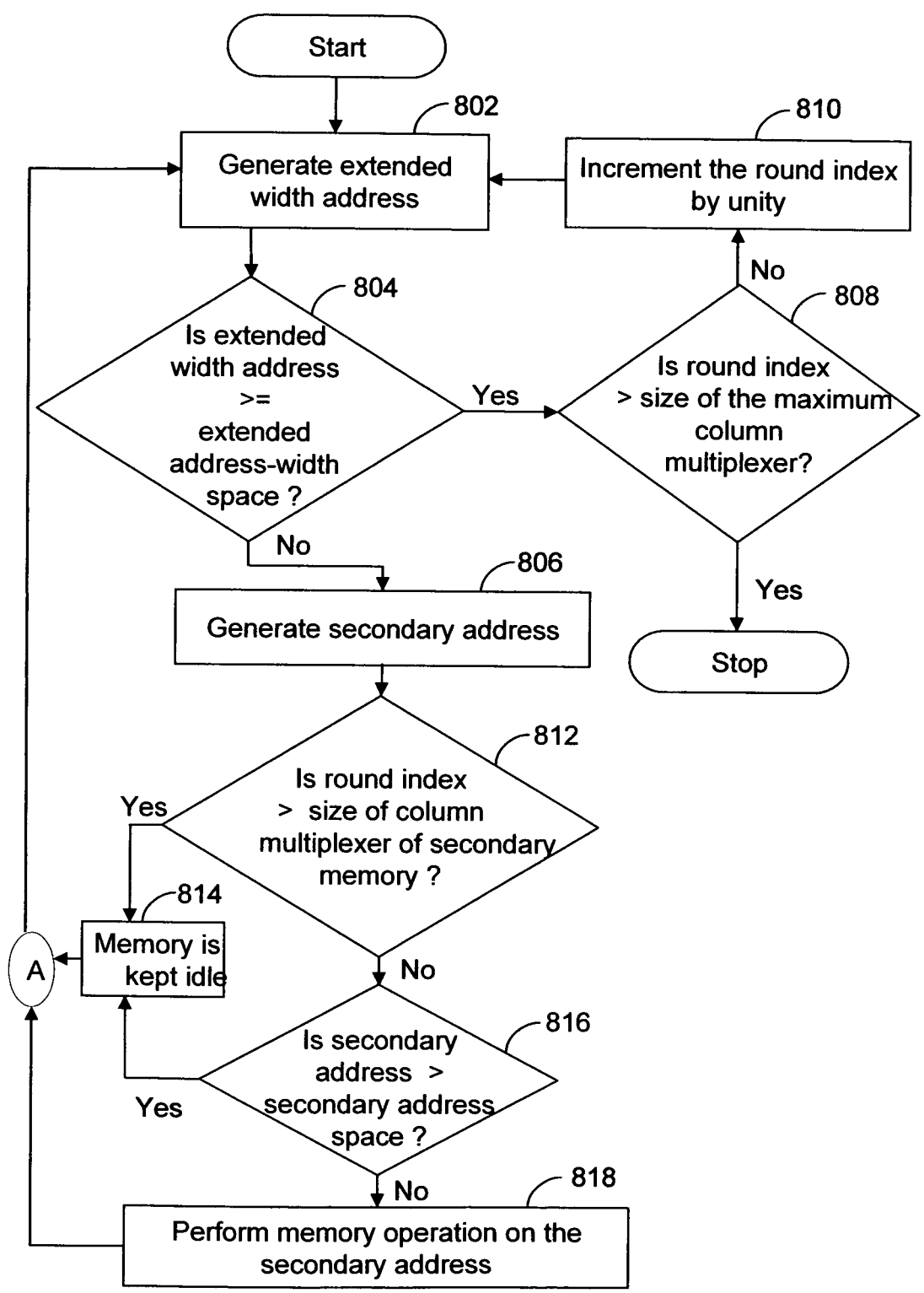
FIG. 8 illustrates a detailed flow chart of address generation mechanism for primary and secondary memories using an extended address-width register, in accordance with an embodiment of the present invention.

FIG. 8 illustrates a detailed flow chart of an address generation mechanism for primary and secondary memories using an extended address-width register, in accordance with an embodiment of the present invention. To describe the flowchart as depicted in FIG. 8, references may be made to FIGS. 3, 4, 5, 6, 7 and 9, although it will be apparent to those skilled in the art that the implementation details of the figure can be applicable to any other embodiment of the present invention.

At 802, an extended width address is generated corresponding to a memory location of an extended address-width memory using extended address-width register 614. The extended width address is generated in a number of cycles equal to the size of the column multiplexer of the memory with the largest column multiplexer ($CM_{max}$). A count of the number of cycles is kept using a variable round index. The round index refers to the present number of cycles used in the generation of the extended width address. In the first cycle, i.e. round index is 1, the extended width address generated is '0'. Thereafter, the extended width address is incremented by a number equal to the size of the column multiplexer of the memory with the largest column multiplexer. The extended width address stops incrementing when the extended width address equals or exceeds the address space of the extended address-width memory. In the second cycle, the extended width address generated is '1'. The extended width address is subsequently incremented by $CM_{max}$. The extended width address stops incrementing when the extended width address equals or exceeds the address space of the extended address-width memory. The number of addresses generated in one cycle would be equal to the number of physical rows in the extended address-width memory. The process for generating extended width address stops when the round index is greater than $CM_{max}$.

At 804, the extended width address generated is compared with the address space of the extended address-width memory. If it is determined at 804 that the extended width address is less than the extended width address space, 806 is executed. At 806, a secondary address corresponding to memory locations in the secondary memories is generated. The secondary address generated for the secondary memory, such as secondary memories 504a, 504b, and 504c is given by the following mathematical expression:

$$SA = \left(\frac{EA}{R}\right) + EA\%(CM_{Size}) \quad (3)$$

wherein,
SA refers to the secondary address;
EA refers to the extended width address;
$CM_{Size}$ refers to the size of the column multiplexer of the secondary memory;
"%" implies a remainder operator; and
R equals the ratio of size of the column multiplexer for the memory with the largest column multiplexer size ($CM_{max}$) to the size of the column multiplexer for the secondary memory. However, if it is determined at 804 that the extended width address generated is greater than or equal to the extended width address space, 808 is executed. At 808, the round index is compared with $CM_{max}$. If it is determined at 808 that the round index is less than or equal to $CM_{max}$, 810 is executed. At 810, the round index is incremented by 1. Subsequently, 802 is executed. However, if it is determined at 808 that the round index is greater than $CM_{max}$, the address generation is completed and the method terminates.

Subsequent to 806, 812 is executed. At 812, the round index is compared with the size of the column multiplexer for the secondary memory. If it is determined at 812 that the round index is more than the size of the column multiplexer for the secondary memory, the secondary memory is kept in the idle state at 814. The idle state of the secondary memory refers to the state when the read or write operation is not performed on the secondary memory. Subsequently, 802 is executed.

However, if it is determined at 812 that the round index is less than or equal to the size of the column multiplexer for the secondary memory, 816 is executed. At 816, the secondary address generated in 806 is compared with the secondary address space. If it is determined at 816 that the secondary address is greater than the secondary address space, 814 is performed, where the memory is kept idle. However, if it is determined at 816 that the secondary address is less than or equal to the secondary address space, 818 is executed. At 818, memory read/write operations are performed on the memory location corresponding to the secondary address. Subsequently, 802 is executed to generate the extended width address.

Figure 9:
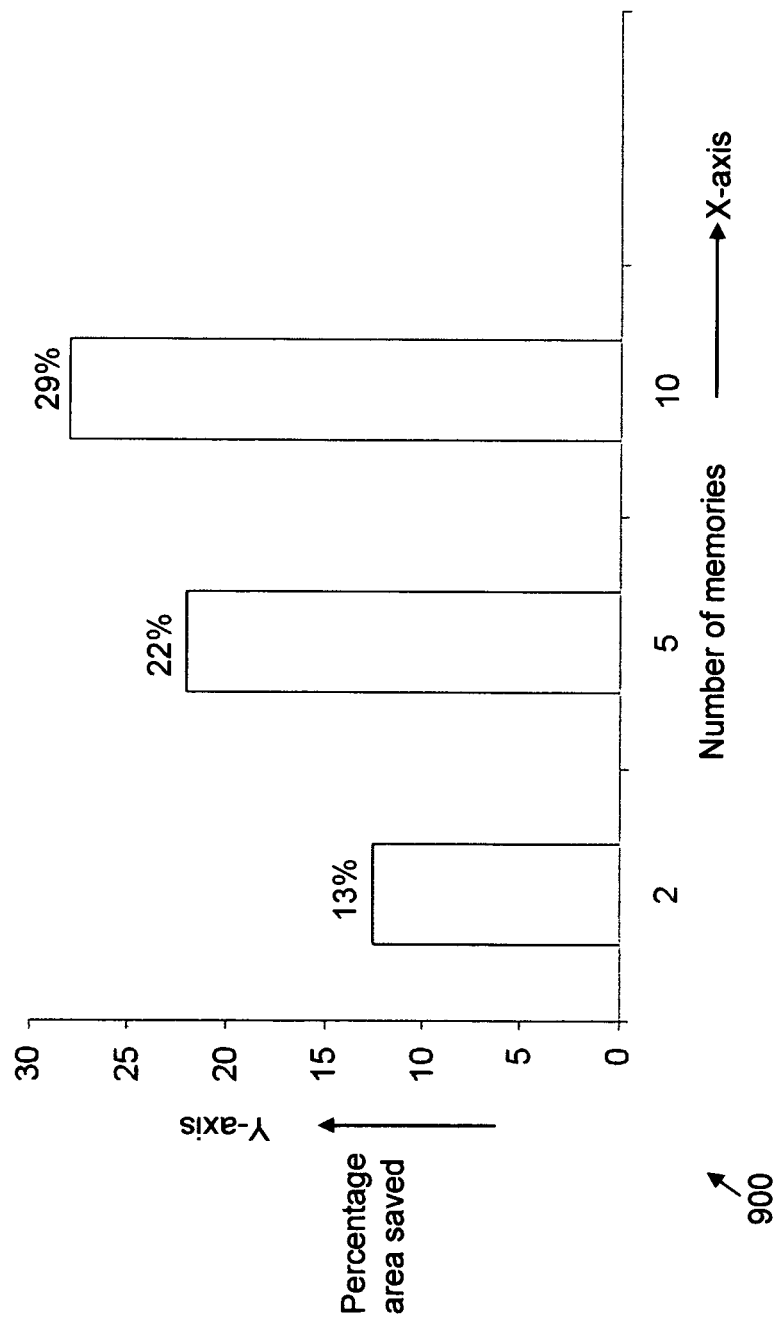
FIG. 9 illustrates a bar chart showing percentage area saved when two, five, and ten different memories are simultaneously tested using a single BIST controller, in accordance with an embodiment of the present invention.

FIG. 9 illustrates a bar chart 900 showing percentage area saved when two, five, and ten different memories are simultaneously tested using a single BIST controller, in accordance with an embodiment of the present invention. To describe the bar chart illustrated herein in FIG. 9, references may be made to FIGS. 3, 4, 5, 6, 7 and 8, although it will be apparent to those skilled in the art that the implementation details of the figure can be applicable to any other embodiment of the present invention.

The bar chart 900 includes the number of memories represented on the X-axis and the percentage chip area saved represented on the Y-axis. The bar chart 900 shows percentage chip area saved by the usage of the present invention as compared to the usage of the prior art solution which entails individually generating addresses for each memory. The two solutions (present invention and the prior art solution) were implemented in Verilog Register Transfer Level (RTL). The designs were then simulated and synthesized with an industry standard synthesis tool to generate comparative data.

The two solutions were compared under three scenarios viz. two memories, five memories, and ten memories with a mixture of '1 k×32' and '2 k×32' configurations. The results show superior synthesis area reports and identical simulation area reports over the prior art solution.

Additionally, the synthesis results show an improvement on sequential as well as combinatorial area reports. The area savings for the various numbers of memories is as follows: 2 memories—area savings: 13%; 5 memories—area savings: 22%; and 10 memories—area savings: 29%. The results show superior synthesis area reports and identical simulation area reports over the prior art solution.

In accordance with various embodiments of the present invention, the BIST controller may implement one or more algorithms, for example, proximity-based BIST algorithms. Further, the BIST controller may be implemented in the form of software, hardware with software modules running in it or a combination of hardware and software.

The present invention described above has numerous advantages. The present invention facilitates an optimized approach of generating addresses and simultaneously testing memories using a single BIST controller implementing proximity-based BIST algorithms. In particular, the proximity-based BIST algorithms aids in testing all address/memory locations of the memories at once. Thus, a lot of effort and time is saved. Further, the single BIST controller is able to cater multiple memories at one time. For example, the BIST controller is capable of generating addresses for multiple memories at one time and testing all memory locations of the memories at once. Also, the BIST controller is capable of generating addresses for the memories having the same or different sized column multiplexers, the same or different sized memory locations, and the same or different number of memory locations. Moreover, the present invention maintains correct address sequence required by the algorithms described above. Additionally, the address generation mechanism implemented by the present invention help in saving a significant chip area of the memories, thereby reducing the manufacturing cost of the product.

The method and system for optimizing address generation for simultaneously running proximity-based BIST algorithms, as described in the present invention, may be embodied in the form of a computer system. Typical examples of a computer system include a general-purpose computer, a programmed microprocessor, a micro-controller, a peripheral integrated circuit element, and other devices or arrangements of devices, which are capable of implementing the steps that constitute the method of the present invention. Moreover, the present invention may also be embodied in the form of an embedded controller. Typical examples of the embedded controller include a general-purpose computer, a programmable microprocessor, a micro controller, a peripheral integrated circuit element, ASIC's (Application Specific Integrated Circuit), PLC's (Programmable Logic Controller), and other devices or arrangements of devices that are capable of implementing the steps that constitute the method for the present invention.

The computer system comprises a computer, an input device, and a display unit. The computer comprises a microprocessor, which is connected to a communication bus. The computer also includes a memory, which may be a Random Access Memory (RAM) and Read Only Memory (ROM). The computer system also comprises a storage device, which can be a hard disk drive or a removable storage drive such as a floppy disk drive, an optical disk drive, and the like. The storage device can also be other similar means for loading computer programs or other instructions into the computer system.

The computer system or the embedded controller executes a set of instructions that are written in one or more storage elements to process input data. The storage elements may also hold data or other information, as desired. The storage element may be in the form of an information source or a physical memory element present in the processing machine. Exemplary storage elements include a hard disk, a DRAM, an SRAM and an EPROM. The storage element may be external to the computer system, and connected to or inserted into the computer, to be downloaded at or prior to the time it is used. Examples of such external computer program products are computer-readable storage mediums such as CD-ROMS, Flash chips, floppy disks, and the like.

The set of instructions may include various commands that instruct the processing machine to perform specific tasks, such as the steps that constitute the method of the present invention. The set of instructions may be in the form of a software program. The software may be in various forms such as system software or application software. Further, the software may be in the form of a collection of separate programs, a program module with a larger program, or a portion of a program module. The software may also include modular programming in the form of object-oriented programming. The software program with the set of instructions can be embedded in a computer program product for use with a computer, with the computer program product comprising a tangible computer-usable medium that has a computer-readable program code embodied therein. Processing of input data by the processing machine may be in response to users' commands to the results of previous processing, or in response to a request made by another processing machine.

The modules described herein may include processors and program instructions for implementing the functions of the modules described herein. Some or all the functions could be implemented by a state machine that has no written program instructions, or in one or more application-specific integrated circuits (ASICs), in which each function or some combinations of certain of the functions are implemented as custom logic.

In the foregoing specification, the invention and its benefits and advantages have been described with reference to specific embodiments. However, one with ordinary skill in the art would appreciate that various modifications and changes can be made, without departing from the scope of the present invention. Accordingly, the specification and figures are to be regarded in an illustrative rather than a restrictive sense, and all such modifications are intended to be included within the scope of the present invention.

What is claimed is:

1. A method for generating addresses for memories and simultaneously testing the memories using a single Built-in Self Testing (BIST) controller, each of the memories comprising one or more memory locations, the method comprising:
   a. selecting a memory of the memories based on a pre-defined rule, each of the memories having a corresponding pre-defined number of physical rows;
   b. comparing the pre-defined number of physical rows of the selected memory with the pre-defined number of physical rows of other memories;
   c. extending size of an address-width register to form an extended address-width register based on the comparison performed in (b);
   d. generating an extended width address using the extended address-width register, wherein the extended width address is used to generate addresses for the memories; and
   e. performing read and write operations on the memories using the single BIST controller based on pre-defined rules, wherein the read and write operations provide testing of the memories.

2. The method according to claim 1, wherein the selected memory is a primary memory.

3. The method according to claim 1, wherein the other memories are secondary memories.

4. The method according to claim 1, wherein the pre-defined rule comprises selecting the memory having the largest size of column multiplexer ($CM_{max}$).

5. The method according to claim 1, wherein the extended width address is generated using a pre-defined mathematical expression.

6. The method according to claim 1, wherein the extended width address is generated in a number of cycles equal to the size of a column multiplexer of the selected memory.

7. The method according to claim 6 further comprising maintaining an index to count the number of cycles.

8. The method according to claim 1, wherein the extended width address is a primary address.

9. The method according to claim 1, wherein the addresses generated using the extended width address are secondary addresses.

10. The method according to claim 1 further comprising comparing the extended width address with an address space of the extended address-width memory.

11. The method according to claim 1, wherein the read and write operations comprise:
   (i) writing test patterns in each of the one or more memory locations; and (ii) reading data written in each of the one or more memory locations.

12. The method according to claim 11 further comprising comparing the data with the test patterns written in each of the one or more memory locations.

13. The method according to claim 12 further comprising generating a status signal for each of the one or more memory locations based on the comparison.

14. The method of claim 1, wherein the method is implemented on a plurality of memories having at least one of: different or same sized column multiplexers, different or same sized memory locations, and different or same number of memory locations.

15. A method for generating addresses for memories using a single Built-in Self Testing (BIST) controller, each of the memories comprising one or more memory locations, the method comprising:
   a. extending size of an address-width register to form an extended address-width register based on a pre-defined check;
   b. generating an extended width address using the extended address-width register, wherein the extended width address is a primary address; and
   c. generating secondary addresses for the memories using the primary address, wherein each of the memories have a corresponding pre-defined number of physical rows, wherein the pre-defined check comprises comparing the pre-defined number of physical rows of the selected memory with the pre-defined number of physical rows of the other memories.

16. The method according to claim 15, wherein the memory with the largest size of column multiplexer (CM.sub.max) is selected.

17. A Built-in Self Testing (BIST) controller for generating addresses for memories and simultaneously testing the memories, each of the memories comprising one or more memory locations, the BIST controller comprising:
   a. an address generator, the address generator comprising an address-width register, the address generator configured for:
      (i) extending size of the address-width register to form an extended address-width register based on a pre-defined check;
      (ii) generating an extended width address for a memory; wherein the extended width address is used to generate addresses for the memories; and
   b. one or more comparators, the one or more comparators configured for testing the addresses generated by the address generator, wherein each of the memories having a corresponding pre-determined number of physical rows, wherein the pre-defined check comprises comparing the pre-determined number of physical rows of the selected memory with the pre-determined number of physical rows of the other memories.

18. The BIST controller according to claim 17, wherein the extended width address is generated by the address generator using the extended address-width register.

19. The BIST controller according to claim 17 further comprising one or more shift registers.

20. The BIST controller according to claim 17 further comprising one or more address clippers.

21. The BIST controller according to claim 17 further comprising one or more adders.

22. The BIST controller according to claim 17 further comprising one or more multiplexers.

23. A computer program product for use with a computer, the computer program product comprising a tangible non-transitory computer readable storage medium having a computer readable program code embodied therein for generating addresses for memories and simultaneously testing the memories using a single Built-in Self Testing (BIST) controller, each of the memories comprising one or more memory locations, the computer readable program code comprising:
   a. program instructions for selecting a memory of the memories based on a pre-defined rule, each of the memories having a corresponding pre-defined number of physical rows;
   b. program instructions for comparing the pre-defined number of physical rows of the selected memory with the pre-defined number of physical rows of the other memories;
   c. program instructions for extending size of an address-width register to form an extended address-width register based on the comparison;
   d. program instructions for generating an extended width address using the extended address-width register, wherein the extended width address is used to generate addresses for the memories; and
   e. program instructions for performing read and write operations on the memories using the single BIST controller based on pre-defined rules, wherein the read and write operations provide testing of the memories.

24. The computer program product according to claim 23 further comprising program instructions for selecting the memory with the largest size of column multiplexer (CM.sub.max).

25. The computer program product according to claim 23 further comprising program instructions for generating the extended width address in a number of cycles equal to the size of a column multiplexer of the selected memory.

26. The computer program product according to claim 23 further comprising program instructions for maintaining an index to count the number of cycles.

* * * * *